United States Patent [19]
Czamara

[11] Patent Number: 6,107,818
[45] Date of Patent: Aug. 22, 2000

[54] HIGH SPEED, REAL-TIME, STATE INTERCONNECT FOR AUTOMATIC TEST EQUIPMENT

[75] Inventor: Allen J. Czamara, Auburn, Mass.

[73] Assignee: Teradyne, Inc., Boston, Mass.

[21] Appl. No.: 09/060,987

[22] Filed: Apr. 15, 1998

[51] Int. Cl.[7] ...................... G01R 31/26; G01R 31/3181
[52] U.S. Cl. ...................... 324/765; 324/73.1; 324/158.1
[58] Field of Search ........................... 324/511, 537, 324/765, 158.1, 73.1

[56] References Cited

U.S. PATENT DOCUMENTS

| | | | |
|---|---|---|---|
| 5,032,789 | 7/1991 | Firooz et al. | 324/158.1 |
| 5,321,702 | 6/1994 | Brown et al. | 371/27 |
| 5,465,361 | 11/1995 | Hoenninger, III | 395/700 |
| 5,499,248 | 3/1996 | Behrens et al. | 371/22.1 |
| 5,696,772 | 12/1997 | Lesmeister | 371/27 |

FOREIGN PATENT DOCUMENTS

| | | | |
|---|---|---|---|
| 0 474 274 A2 | 3/1992 | European Pat. Off. | G01R 31/28 |
| 196 31 005 A1 | 2/1997 | Germany | G01R 31/3167 |
| 97/12254 A1 | 4/1997 | WIPO | G01R 31/28 |

OTHER PUBLICATIONS

Steve Johnson and Steve Scott, A *Supercomputer System Interconnect and Scalable IOS*, 1995, pp. 3–15. (month unavailable).

*Primary Examiner*—Glenn W. Brown
*Attorney, Agent, or Firm*—Teradyne Legal Dept.

[57] ABSTRACT

A tester is disclosed in which state coherency is maintained between functional blocks of the tester by way of a novel state distribution and recombination network. The network includes a plurality of nodes configured to provide point-to-point links between pairs of functional blocks. Further, time delays through the point-to-point links can be adjusted by selecting a suitable node configuration and by programming delay circuitry included in each node. The network therefore maintains state coherence between the functional blocks by ensuring that delays throughout the test system are both deterministic and adjustable. The tester is particularly useful for testing complex, mixed-signal semiconductor devices.

33 Claims, 6 Drawing Sheets

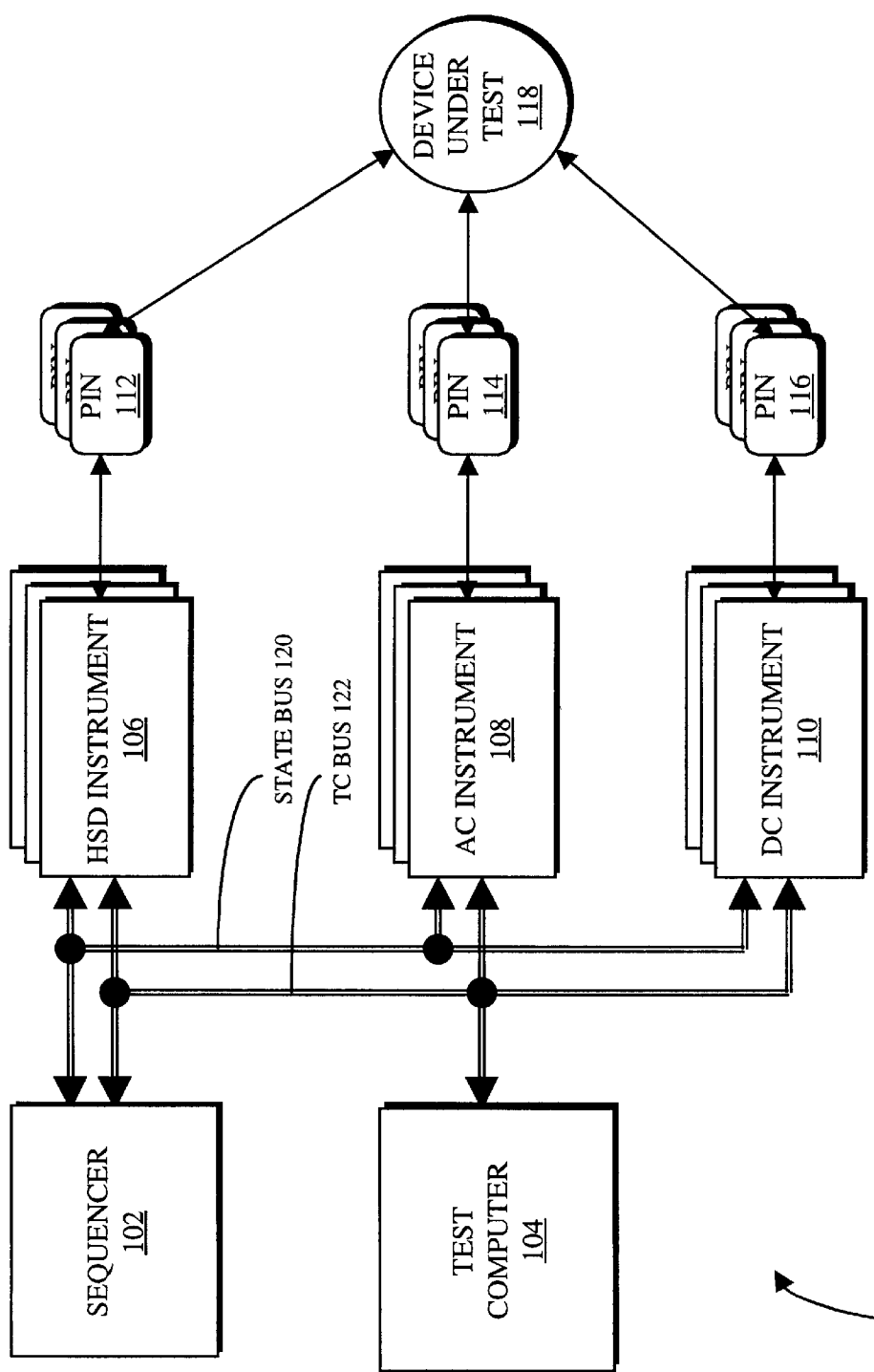
FIG. 1 - PRIOR ART

HIGH SPEED, REAL-TIME, STATE INTERCONNECT FOR AUTOMATIC TEST EQUIPMENT

This invention relates generally to automatic test equipment, and more specifically to high-speed, general purpose, automatic test equipment.

Automatic test equipment (also known as a "tester") is commonly used in processes for manufacturing semiconductor devices to determine whether the manufactured devices are defective. Testers generally include computerized control circuitry that controls various types of instruments used to perform tests including applying signals to a device under test, detecting signals produced by the device under test, and measuring any parameters related to the device under test. The computerized control circuitry then generally compares the detected signals and measured parameters with stored expected values, thereby determining whether the device under test contains defects.

Semiconductor devices may include digital circuitry, analog circuitry, or both. Devices that include both analog and digital circuitry are commonly called mixed-signal devices, and the testers that test them are commonly called mixed-signal testers. Further, the speed, density, and overall complexity of these devices generally increase with successive generations of the devices. Accordingly, it is increasingly important that testers provide a high-level of operator control and programming flexibility in order to test these devices thoroughly.

FIG. 1 shows a tester 100 that is useful for testing mixed-signal devices such as a device under test (DUT) 118. In particular, the tester 100 includes a test computer 104 coupled to a sequencer 102 and a plurality of instruments such as a high-speed digital (HSD) instrument 106, a precision AC instrument 108, and a precision DC instrument 110. The test computer 104 is typically housed in a workstation (not shown) and generally provides signals for controlling the sequencer 102 and the instruments 106, 108, and 110. Further, tester pins 112, 114, and 116 connect the instruments 106, 108, and 110, respectively, to electrical nodes of the DUT 118.

The test computer 104 is coupled to the sequencer 102 and the instruments 106, 108, and 110 by way of a test computer (TC) bus 122. Similarly, the sequencer 102 is coupled to the instruments 106, 108, and 110 by way of a state bus 120.

During a typical test session, a test engineer uses the workstation to specify various operating conditions and to enter various tester commands. For example, the test engineer may specify a test cycle time and values to be applied to and detected from the DUT 118 during each test cycle. The values that are specified for a particular test cycle are collectively known as a "vector," and a group of vectors that constitutes a complete test is generally known as a "pattern."

The test engineer then typically loads a pattern into a memory (not shown) included in the sequencer 102 and enters a command to start the test. This generally causes the sequencer 102 to read a different vector during each test cycle, and place data derived from the vectors on the state bus 120. The data typically includes both the values that are to be applied or detected by certain instruments during a test cycle and the times when these values are to be applied or detected relative to the start of the test cycle.

For example, the information may direct the HSD instrument 106 to apply and detect digital signals at a node of the DUT 109. The information may also direct the AC instrument 108 to apply and capture analog signals at another node of the DUT_109.

Further, the information may direct the DC instrument 110 to apply or measure specified levels at still another node of the DUT 109.

The state bus 120 also typically includes various clock signals and condition flags that may be used by the test computer 104 and the instruments 106, 108, and 110 during each test cycle. The information on the state bus 120 therefore defines the status of the tester 100 during each cycle of tester operation.

Although the tester 100 has been successfully used to test many complex mixed-signal devices, we have recognized several shortcomings. In particular, there has arisen a need for testers that can test complex semiconductor devices that are sometimes called "systems-on-a-chip." These complex devices are generally high-speed, high-density, mixed-signal devices that require an even higher level of operator control and programming flexibility than can be achieved with the conventional tester configuration described above.

For example, in order to test complex devices like the systems-on-a-chip, it would be desirable to have a tester with more sequencers. This is because such devices generally have a greater number of nodes, and therefore a greater number of nodes operating at different data rates. By programming multiple sequencers to operate according to different test cycle times, the test engineer would be able to test multiple nodes operating at different data rates simultaneously. However, increasing the number of sequencers generally complicates the distribution of state information to the instruments.

As described above, the tester 100 includes a sequencer 102 that distributes state information to the instruments 106, 108, and 110 by way of a state bus 120. In a typical tester configuration, the instruments are arranged in several card cages, and the sequencer 102 is included on a board in one of the card cages. Further, the state bus 120 and the TC bus 122 are connected to the card cages in a daisy chain fashion.

Although the daisy chain bus connection used in the tester 100 effectively distributes state information from the sequencer 102 to the instruments 106, 108, and 110, we have recognized that it would not be as effective in a tester with more sequencers. This is because having more sequencers would typically require more state busses, thereby increasing the number of bus connections to the instruments and complicating the clocking required for deterministic and adjustable delays throughout the system. It would therefore be more difficult to ensure that state information was communicated to the instruments 106, 108, and 110 at proper and predictable times.

Further, having daisy chain bus connections in a tester generally means that state information is distributed through a pipeline with each card cage in the tester at a different level in the pipeline. Such a configuration is generally difficult to implement and not easily adapted to testing high-speed, high-density systems-on-a-chip.

It would therefore be desirable to have a tester that can test complex, high-speed, high-density, mixed-signal semiconductor devices. This tester would have a way of distributing state and other information to all parts of the test system in a manner that provides deterministic and adjustable delays. It would also be desirable to have a tester that has a general purpose and scalable architecture.

SUMMARY OF THE INVENTION

With the foregoing background in mind, it is an object of the invention to provide a tester that can test complex, high-speed, mixed-signal semiconductor devices.

It is another object of the invention to provide a tester that has a general purpose and scalable architecture.

It is still another object of the invention to provide a tester with an improved state distribution scheme that maintains coherency of state information.

The foregoing and other objects are achieved in a tester having a test computer, a plurality of sequencers, a plurality of instruments, and a novel state distribution and recombination network that includes a plurality of link interfaces.

In one embodiment, the test computer, the sequencers, and the instruments exchange state and other information by way of respective link interfaces, which provide bi-directional, point-to-point communication between the tester elements.

In a preferred embodiment, the instruments have respective sequencers, and the test computer and the sequencers exchange state and other information by way of respective bi-directional link interfaces. Further, the link interfaces are arranged in a "star" configuration wherein the respective link interfaces exchange the state and other information through a central link interface.

According to one feature of the invention, each link interface includes logic for combining state information from at least one sequencer.

According to another feature of the invention, each link interface includes programmable pipeline delay elements. Further, delays are adjusted through the state distribution and recombination network by selecting a suitable configuration of the link interfaces and by programming the pipeline delay elements.

Still further objects and advantages will become apparent from a consideration of the ensuing description and drawings.

BRIEF DESCRIPTION OF THE DRAWINGS

The invention will be better understood by reference to the following more detailed description and accompanying drawings in which FIG. 1 is a partial block diagram of a conventional tester;

DESCRIPTION OF THE PREFERRED EMBODIMENT

Figure 2A:
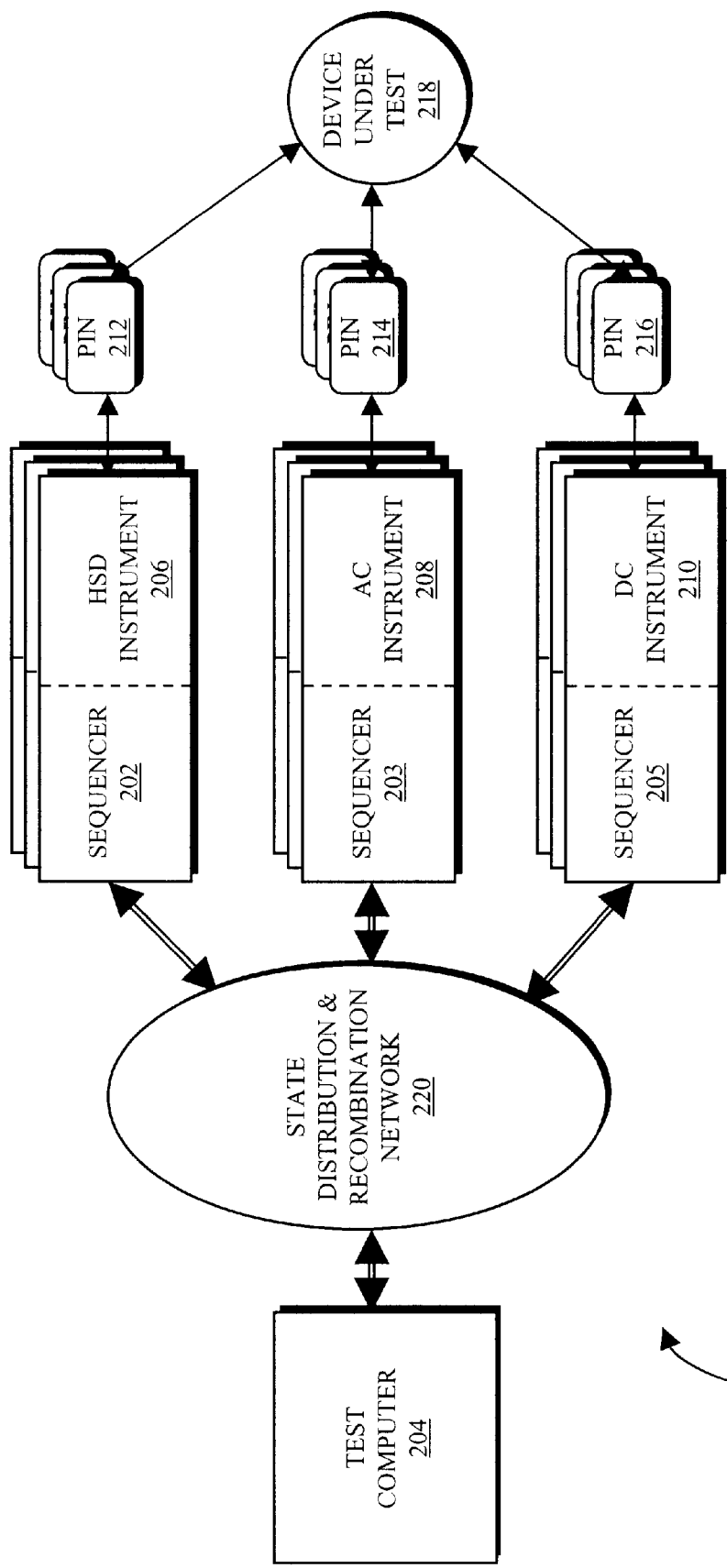
FIG. 2A is a conceptual block diagram of a tester incorporating a state distribution and recombination network in accordance with the present invention.

FIG. 2A is a conceptual block diagram of a tester 200 in accordance with the present invention. The tester 200 includes a test computer 204 and preferably at least one high-speed digital (HSD) instrument, such as an HSD instrument 206; at least one AC instrument, such as an AC instrument 208; and, at least one DC instrument, such as a DC instrument 210. This is because the tester 200 is primarily meant to be used for testing complex mixed-signal semiconductor devices, and these instruments 206, 208, and 210 are typically used for performing tests on devices containing complex analog and digital circuitry.

The instruments 206, 208, and 210 include sequencers 202, 203, and 205, respectively. This significantly enhances a test engineer's ability to control the tester 200 by way of a test program. For example, each of the sequencers 202, 203, and 205 may be programmed to operate according to different test cycle times. This means that the tester 200 can apply and detect signals at different electrical nodes of a device under test and at different data rates for each node. Also, the test program may consist of several test patterns, and different test patterns may be loaded into respective memories (not shown) of the sequencers 202, 203, and 205. This means that the instruments 206, 208, and 210 can be controlled independently, thereby allowing independent control of instruments used for performing analog and digital tests. Such a high-level of operator control and programming flexibility is important for thoroughly testing complex mixed-signal semiconductor devices.

Tester pins 212, 214, and 216 connect the instruments 206, 208, and 210, respectively, to electrical nodes of a mixed-signal device under test (DUT) 218. The test computer 204 and the pins 212, 214, and 216 are essentially the same as the prior art. The sequencers 202, 203, and 205 and the instruments 206, 208, and 210 are also essentially the same as the prior art. However, in the preferred embodiment of the invention, each sequencer 202, 203, and 205 controls a respective instrument 206, 208, and 210.

Further, each sequencer is preferably situated on the same board as its respective instrument. Accordingly, the sequencer 202 is preferably situated on the same board as the HSD instrument 206; the sequencer 203 is preferably situated on the same board as the AC instrument 208; and, the sequencer 205 is preferably situated on the same board as the DC instrument 210.

However, in alternative embodiments, at least one of the sequencers may control more than one instrument. Nevertheless, it should be understood that higher levels of operator control and programming flexibility are generally achieved as the instrument-to-sequencer ratio is decreased.

In conventional testers, such as the tester 100 shown in FIG. 1, a test computer, a sequencer, and a plurality of instruments are connected to one bus or to several busses. As shown in FIG. 1, the test computer 104, the sequencer 102, and the instruments 106, 108, and 110 are connected to the TC bus 122; and, the sequencer 102, and the instruments 106, 108, and 110 are connected to the state bus 120. This configuration has the advantage of requiring a minimal amount of hardware for interconnecting the elements in the test system 100. However, it also has the disadvantage of having a low-level of performance due primarily to bus contention, especially in those tester configurations that include a large number of instruments.

The situation tends to get worse when more sequencers are added to conventional test systems. This is because different sequencers typically produce different sets of state information. Further, because the sequencers might be programmed to operate in accordance with different test cycle times, these different sets of state information may become available at different times during a test. It can therefore become very difficult to maintain state coherence between the elements of conventional test systems that include bus connection schemes.

For this reason, the tester 200 includes a novel state distribution and recombination network 220 that eliminates the disadvantages of conventional bus-based testers. As shown in FIG. 2A, the test computer 204 and the sequencers 202, 203, and 205 are interconnected by the network 220, which has features that ensure deterministic and adjustable delays between the test computer 204, the sequencer 202, the sequencer 203, and the sequencer 205. This guarantees that elements of the test system 200 has a consistent view of the state information produced by the sequencers 202, 203, and 205.

Figure 2B:
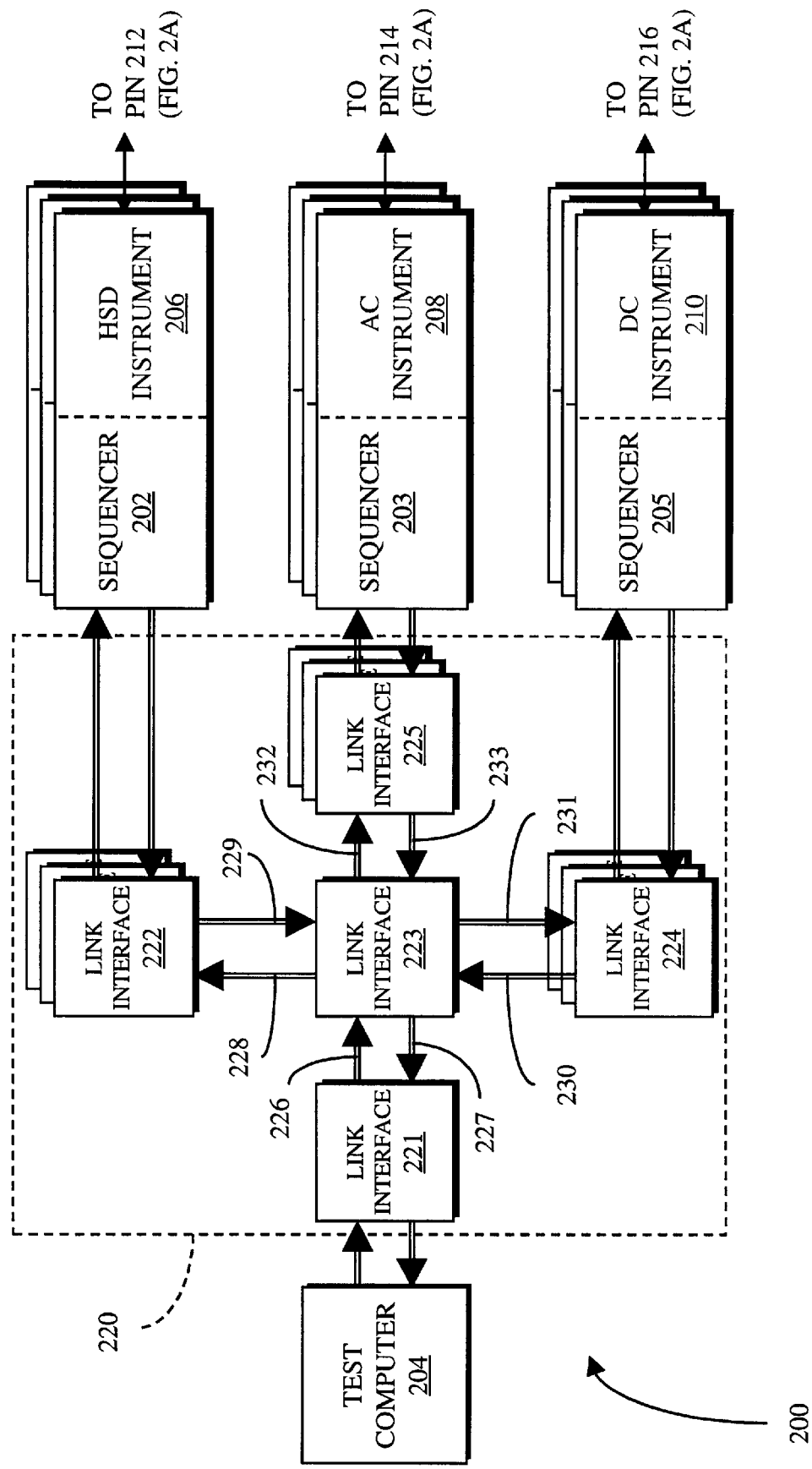
FIG. 2B is a block diagram of the FIG. 2A apparatus showing a detailed view of the state distribution and recombination network including a plurality of link interfaces in a "star" configuration.

FIG. 2B shows that the state distribution and recombination network 220 includes a plurality of nodes or, more precisely, link interfaces 221 through 225. In the preferred embodiment, the network 220 includes one link interface for each element in the test system that is connected to it, and a central link interface. Because the tester 200 has four (4) elements connected to the network 220, the network 220 includes four (4) peripheral link interfaces 221, 222, 224, and 225 and a central link interface 223 for a total of five (5) link interfaces. It should be understood that the test system 200 is scalable such that alternate embodiments with more elements connected to the network 220 have state distribution and recombination networks 220 with correspondingly more link interfaces.

The link interfaces in the state distribution and recombination networks are preferably arranged in a "star" configuration. For example, the tester 200 includes the test computer 204 and the sequencers 202, 203, and 205 that exchange data with the peripheral link interfaces 221, 222, 225, and 224, respectively. Further, the peripheral link interfaces 221, 222, 225, and 224 are coupled to a central link interface 223. As a result, whenever data is passed between any pair of points or elements in the tester 200, the data may pass through the same number of link interfaces. For the illustrative example shown in FIG. 2B, this number is three (3).

For example, information produced by the sequencer 202 for distribution to the test computer 204 passes through the link interfaces 222, 223, and 221. Similarly, state information from the sequencer 202 may pass through the link interfaces 222, 223, and 225 to reach the sequencer 203. Further, state information from the sequencer 202 may pass through the link interfaces 222, 223, and 224 to reach the sequencer 205. This means that state information produced by any one of the sequencers 202, 203, and 205 and distributed to any other element in the test system 200 is subject to a predictable amount of delay.

Accordingly, state information produced and distributed by the sequencers 202, 203, and 205 by way of the network 220 is subject to delays that are deterministic. It will be described below that these delays are also adjustable. As a result, the test computer and the sequencers included in the tester 200 can view state and other information produced by any one of the sequencers 202, 203, and 205 at a predictable time and preferably at essentially the same time.

This is a significant advantage over conventional bus-based test systems in which the elements of the test system are interconnected by a daisy chain bus, and state and other information is distributed through a pipeline with the system elements at different levels in the pipeline. Because the information must be clocked through the pipeline, the elements of such a test system generally cannot view the state information simultaneously.

Further, such bus-based test systems are not easily scalable to provide the performance needed to test complex mixed-signal semiconductor devices. This is because additional sequencers would generally have to be provided along with additional daisy chain bus connections, thereby further complicating clocking and state distribution requirements for the test system. Even if a sufficient number of sequencers and bus connections were provided and the clocking problems were solved, the bus-based test system still cannot guarantee state coherence between the system elements. Not only is the tester 200 easily scalable by simply adding link interfaces, but it also maintains deterministic and adjustable delays throughout the test system, thereby ensuring state coherency.

The link interfaces 221 through 225 are interconnected and coupled to elements in the test system 200 by pairs of unidirectional links. For example, links 226 and 227 interconnect the peripheral link interface 221 and the central link interface 223. Similarly, links 228 and 229 interconnect the peripheral link interface 222 and the central link interface 223; links 230 and 231 interconnect the peripheral link interface 224 and the central link interface 223; and, links 232 and 233 interconnect the peripheral link interface 225 and the central link interface 223.

Widths of the uni-directional links and corresponding data rates can be selected to obtain a desired level of functionality and performance. In an illustrative embodiment, the uni-directional links might be 26-bits wide and might be clocked at about 100 MHz. Accordingly, each uni-directional link might reserve twenty-three (23) lines for state information and period synchronization, two (2) lines for "fail" and "condition" flags, and one (1) line for a system clock. However, it should be understood that the actual values selected for the widths of the links and the data rates, and the actual assignments of data, flags, and clocks to lines in each link, are not important to the invention. Also, communication between the test computer 204, the network 220, and the sequencers 202, 203, and 205 is controlled by a coherent state controller (not shown), the implementation of which is also not important to the invention.

Figure 2C:
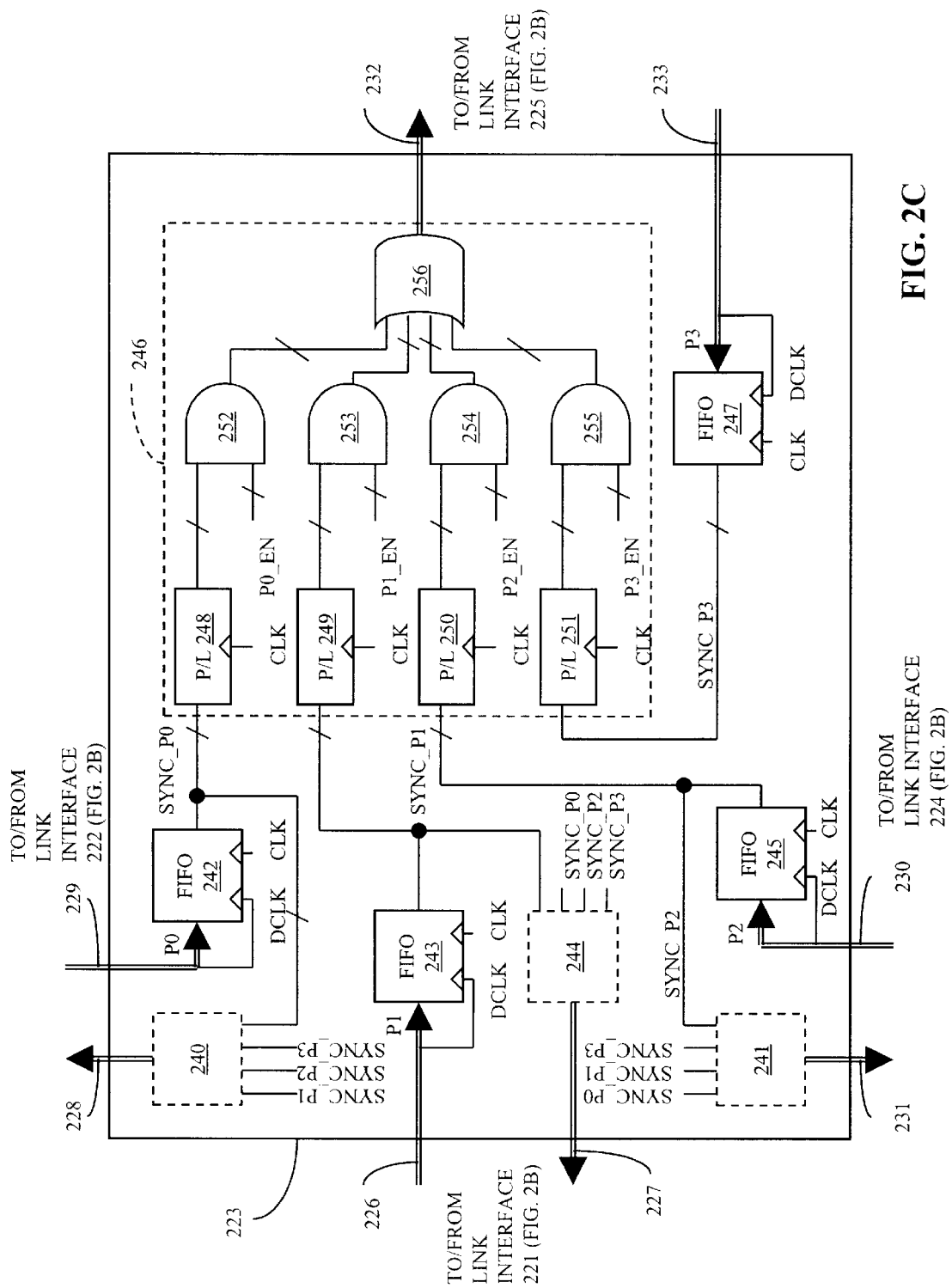
FIG. 2C is a partial schematic diagram of one of the link interfaces included in the FIG. 2B apparatus.

FIG. 2C shows a simplified schematic diagram of a preferred implementation of the central link interface 223. The peripheral link interfaces 221, 222, 224, and 225 are implemented in a similar manner. In particular, FIG. 2C shows the link pair 226 and 227, which carries state and other information between the central link interface 223 and the peripheral link interface 221; the link pair 228 and 229, which carries information between the central link interface 223 and the peripheral link interface 222; the link pair 230 and 231, which carries information between the central link interface 223 and the peripheral link interface 224; and, the link pair 232 and 233, which carries information between the central link interface 223 and the peripheral link interface 225.

State and other information P0, P1, P2, and P3 passes from the peripheral link interfaces 222, 221, 224, and 225, respectively, to the central link interface 223. Further, state and other information P0, P1, P2, and P3 are applied to FIFO elements 242, 243, 245, and 247, respectively.

As mentioned above, the uni-directional links have selected widths and data rates. Accordingly, the information P0, P1, P2, and P3 have a selected width and the FIFO's 242, 243, 245, and 247 are therefore meant to depict multi-bit FIFO's. This depiction merely simplifies the schematic shown in FIG. 2C and it therefore should be understood that alternate implementations of the FIFO's are possible. Further, each FIFO is provided with clocks DCLK and CLK with selected frequencies. The clock DCLK is primarily used for loading valid data P0, P1 P2, and P3 into the FIFO's 242, 243, 245, and 247, and the clock CLK is primarily used for clocking the valid data through the FIFO's 242, 243, 245, and 247.

Although the FIFO's 242, 243, 245, and 247 preferably have the same depth, the actual depth of the FIFO's 242, 243, 245, and 247 is generally dependent upon the timing requirements of the test system. For example, state data may be distributed at a very fast rate through the network 220, but other processing tasks may inhibit some elements in the test system 200 from having a consistent view of the data. For this reason, it is expected that the depths of the FIFO's 242, 243, 245, and 247 will vary within a range from one (1) to three (3). Nevertheless, the primary purpose of the FIFO's 242, 243, 245, and 247 is to synchronize the state and other information at their inputs (e.g., P0 . . . P3) with the system clock CLK. As a result, synchronized data SYNC_P0, SYNC_P1, SYNC_P2, and SYNC_P3 are provided at the outputs of the FIFO's 242, 243, 245, and 247, respectively.

The data SYNC_P0 is applied to a programmable pipeline delay element 248 included in a delay and recombination block 246. Similarly, the data SYNC_P1 SYNC_P2, and SYNC_P3 are applied to programmable pipeline delay elements 249, 250, and 251, respectively, which are also included in the block 246.

Because the data SYNC_P0, SYNC_P1 SYNC_P2, and SYNC_P3 have the same width as the data P0, P1, P2, and P3, the pipelines 248 through 251 are also meant to depict multi-bit pipelines. This simplifies the schematic shown in FIG. 2C, but it should be understood that alternate implementations of the pipelines are possible. Further, each pipeline is provided with clock CLK, which is used for clocking the synchronized data through the pipelines 248 through 251.

Blocks 240, 241, and 244 are also meant to depict delay and recombination blocks like the block 246 and therefore preferably include the same functional elements as the block 246. This means that the data SYNC_P0, SYNC_P1, SYNC_P2, and SYNC_P3 are also applied to respective programmable pipeline delay elements in these blocks 240, 241, and 244. However, the details of the blocks 240, 241, and 244 are not shown in order to simplify the schematic of FIG. 2C.

As mentioned above, the delay through the network 220 is not only deterministic but also adjustable. There are two ways that this delay can be adjusted. The first way is by selecting different configurations for the link interfaces 221 through 225 in the network 220. Although the star configuration shown in FIG. 2B is preferred, alternate configurations are possible and some are described below. Arranging the link interfaces 221 through 225 in the star configuration means that data exchanged between any two elements in the test system 200 may pass through three (3) link interface modules and is therefore subject to the delays contributed by these interface modules.

Another way of adjusting the delay is by programming values for the depths of the pipeline delay elements in the blocks 240, 241, 244, and 246. Although the actual programmed values are generally dependent upon the technology used to implement the circuitry in the link interfaces 221 through 225, the selected configuration of the link interfaces 221 through 225, and the timing requirements of the system, it is expected that an upper limit for the programmed values will be about one hundred twenty-eight (128).

The depths of the pipeline delay elements in the blocks 240, 241, 244, and 246 are preferably programmed at power-up to account for the worst-case delay in the test system 200. However, the test engineer may reprogram the pipeline delay elements if necessary after power-up.

SYNC_P0, SYNC_P1, SYNC_P2, and SYNC_P3 are clocked through each level of the pipelines 248, 249, 250, and 251, respectively, and then applied to gates 252, 253, 254, and 255, respectively. Further, signals P0_EN, P1_EN, P2_EN, and P2_EN are applied to the gates 252, 253, 254, and 255, respectively, to enable passage of the corresponding synchronized data SYNC_P0 through SYNC_3.

The enable signals P0_EN, P1_EN, P2_EN, and P2_EN have the same width as the synchronized data SYNC_P0 through SYNC_3. This means that all or selected bits of the data in SYNC_P0, SYNC_P1, SYNC_P2, or SYNC_P3 can be allowed to pass through the gates 252 through 255.

In particular, a selected one of the enable signals P0_EN, P1_EN, P2_EN, or P2_EN may be programmed to pass its associated synchronized data SYNC_P0, SYNC_P1 SYNC_P2, or SYNC_P3 through the gate 252, 253, 254, or 255. As a result, that data would be applied to a gate 256 and would pass unchanged through the gate 256 to the link 232.

Alternatively, all or a subset of the enable signals P0_EN, P1_EN, P2_EN, and P2_EN may be programmed to pass their associated synchronized data SYNC_P0, SYNC_P1, SYNC_P2, and SYNC_P3 through the gates 252, 253, 254, or 255. As a result, that data would be applied to the gate 256 and combined synchronized data would be provided on the link 232.

As described above, computerized control circuitry generally compares detected signals and measured parameters with stored expected values, thereby determining whether a device under test contains defects. Fail processors (not shown) included in the instruments preferably perform this act of comparing. Accordingly, if a compared signal or parameter does not match a corresponding expected value, then a fail processor will typically indicate this by setting the fail flag. As mentioned above, a line on each unidirectional link may be reserved for this fail flag.

It is frequently necessary to stop a test whenever such a failure is detected. This avoids continued testing of a device that is known to contain a defect and therefore makes the most efficient use of test time. This is one reason why the enable signals P0_EN, P1_EN, P2_EN, and P2_EN can be programmed to provide combined data on the link 232. As a result, the fail flags produced by each sequencer in the test system 200 can be combined by the gate 256. This means that the tester 200 can be easily programmed to stop a test whenever a failure is detected at the combined output of the gate 256. A failure detected by a fail processor in any instrument in the test system 200 can therefore cause a test to stop. This is commonly called a "halt-on-fail" condition. It should be understood that the link interfaces 221, 222, 224, and 225 also include gates that perform the same "combining" function as the gate 256 and can therefore be programmed in a similar manner.

Instead of using the gate 256 to combine fail flags, the gate 256 may alternatively be used to combine condition flags. For example, the tester 200 may be easily programmed to branch to a different point in the test program whenever a particular condition is detected at the combined output of the gate 256. It should be understood that the link interfaces 221, 222, 224, and 225 can be similarly programmed for branching on a particular condition. These examples for programming the tester 200 are meant to be illustrative and not limiting.

The states of the enable signals P0_EN, P1_EN, P2_EN, and P2_EN are preferably specified at the start of each test cycle. As a result, each element in the test system 200 preferably receives the state and other data that it needs on a cycle-by-cycle basis. This simplifies the distribution of state and other information throughout the test system 200.

Each of the link interfaces 221 through 225 preferably includes the circuitry shown in FIG. 2C. In particular, each link interface includes circuitry for synchronizing state and other data with a system clock (e.g., FIFO's 242, 243, 245, and 247), for adjusting delay time through the state distribution and recombination network (e.g., pipeline delay elements 248 through 251), for enabling or disabling passage of state and other data through the network (e.g., gates 252 through 255), and for logically combining state and other data (e.g., gate 256).

Further, the link interfaces that communicate directly with elements in the test system (e.g., the peripheral link interfaces 221, 222, 224, and 225) preferably have two pairs of unidirectional links for passing state and other data between one of the elements and a central link interface (e.g., the link interface 223).

Moreover, the central link interface (e.g., the link interface 223) preferably has a pair of uni-directional links (e.g., the links 226 and 227, the links 228 and 229, the links 230 and 231, and the links 232 and 233) for communicating with each peripheral link interface in the network (e.g., the link interfaces 221, 222, 224, and 225).

It is important to note that the link interfaces 221 through 225 are meant to be general purpose. For example, the configuration shown in FIG. 2C for the central link interface 223 might also be used to implement each of the peripheral link interfaces 221, 222, 224, and 225. Any unused links might then be connected to suitable levels for safely disabling those links. Further, for test systems that require link interfaces with more link pairs, circuitry for synchronizing, delaying, enabling, and combining data might be suitably added to the configuration shown in FIG. 2C.

From the foregoing description, it is apparent that the present invention offers significant advantages over conventional test systems. For example, additional sequencers are easily added to test systems designed in accordance with the present invention, and state information provided by these sequencers can be distributed in a way that is not only fast but also ensures coherency of the state information. Also, the architecture of these test systems is easily scaled for achieving additional functionality. Also, it is also easy to dedicate sequencers to particular instruments for independently controlling the instruments. These advantages make test systems designed according to the invention suitable for testing complex, high-speed, nixed-signal semiconductor devices.

Having described one embodiment, numerous alternative embodiments or variations might be made. For example, it was described that the link interfaces in the state distribution and recombination network 220 are preferably arranged in a star configuration. However, this was merely an illustration and other arrangements are possible. It should be noted that these alternative arrangements generally lead to trade-offs in performance and manufacturability.

Figure 3:
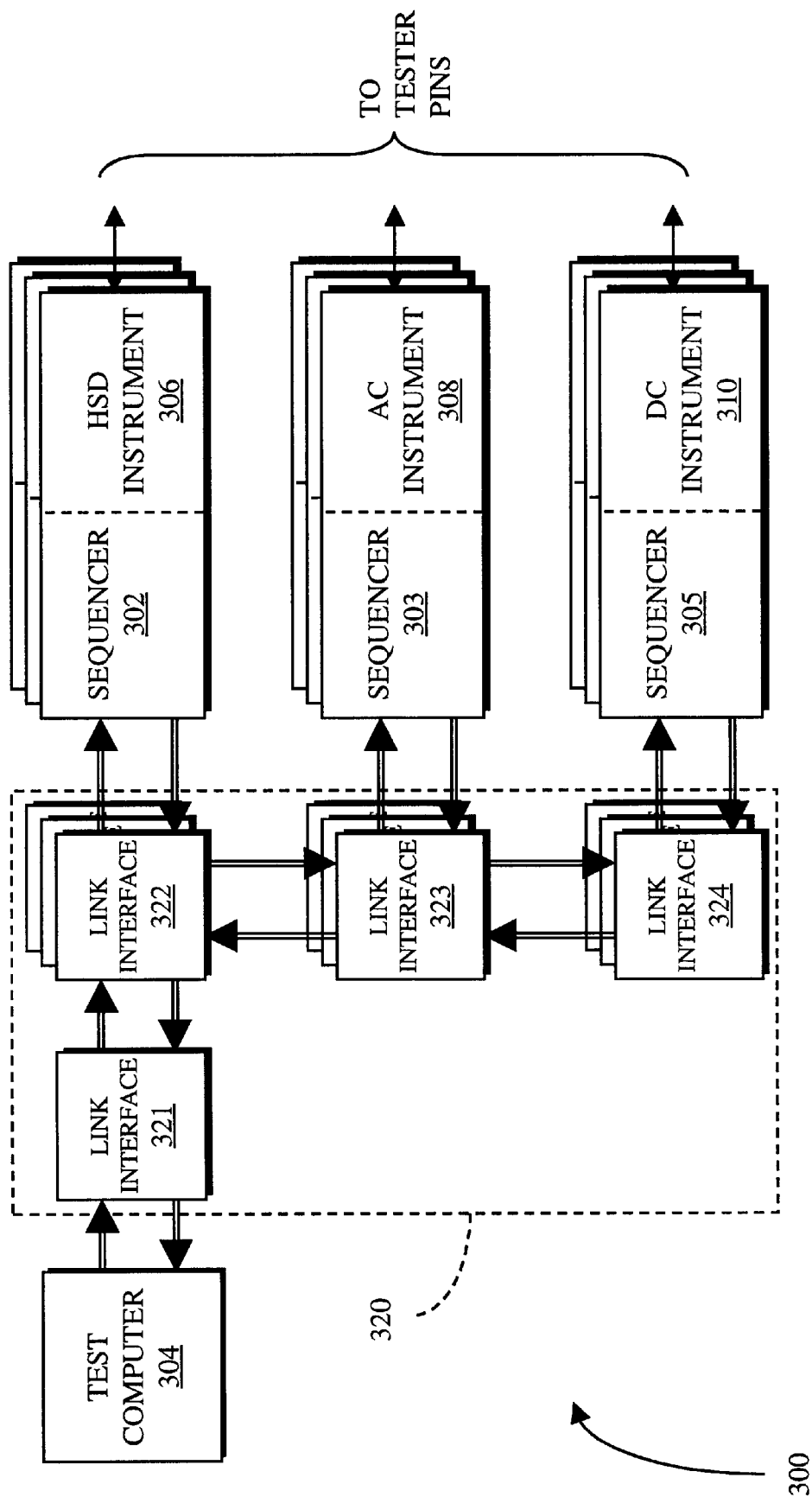
FIG. 3 is a block diagram of the FIG. 2A apparatus showing a detailed view of another embodiment of the state distribution and recombination network.

For example, FIG. 3 shows a tester 300 with a network 320, which includes link interfaces 321 through 324 in a serial arrangement. This arrangement is simpler and requires less hardware than the star arrangement. This is because each link interface in the network 320 has at most three (3) pairs of links communicating with it.

Although the network 320 has a simpler layout, the delays between elements in the test system 300 generally can no longer be adjusted so that they all have the same value. This is because data exchanged by elements in the test system may pass through different numbers of link interfaces. For example, state data passing between the sequencer 202 and the sequencer 203 passes through the two (2) link interfaces 322 and 323. However, state data passing between the sequencer 202 and the sequencer 205 passes through three (3) link interfaces 322, 323, and 324.

Further, data passing between the test computer 304 and the sequencer 305 passes through the four (4) link interfaces 321, 322, 323, and 324. This constitutes the worst-case delay through the network 320. Accordingly, the programmed depths of the pipeline delay elements in the network 320 are restricted by this worst-case delay.

Because the corresponding delay through the network 220 (FIG. 2B) is proportional to the time required to pass through just three (3) link interfaces, the test system 300 generally has more pipeline delay to the DUT than the test system 200. Although the network 320 in the tester 300 has a simpler layout than the network 220 in the tester 200 and is therefore generally easier to manufacture, the tester 300 generally has lower performance than the tester 200.

Figure 4:
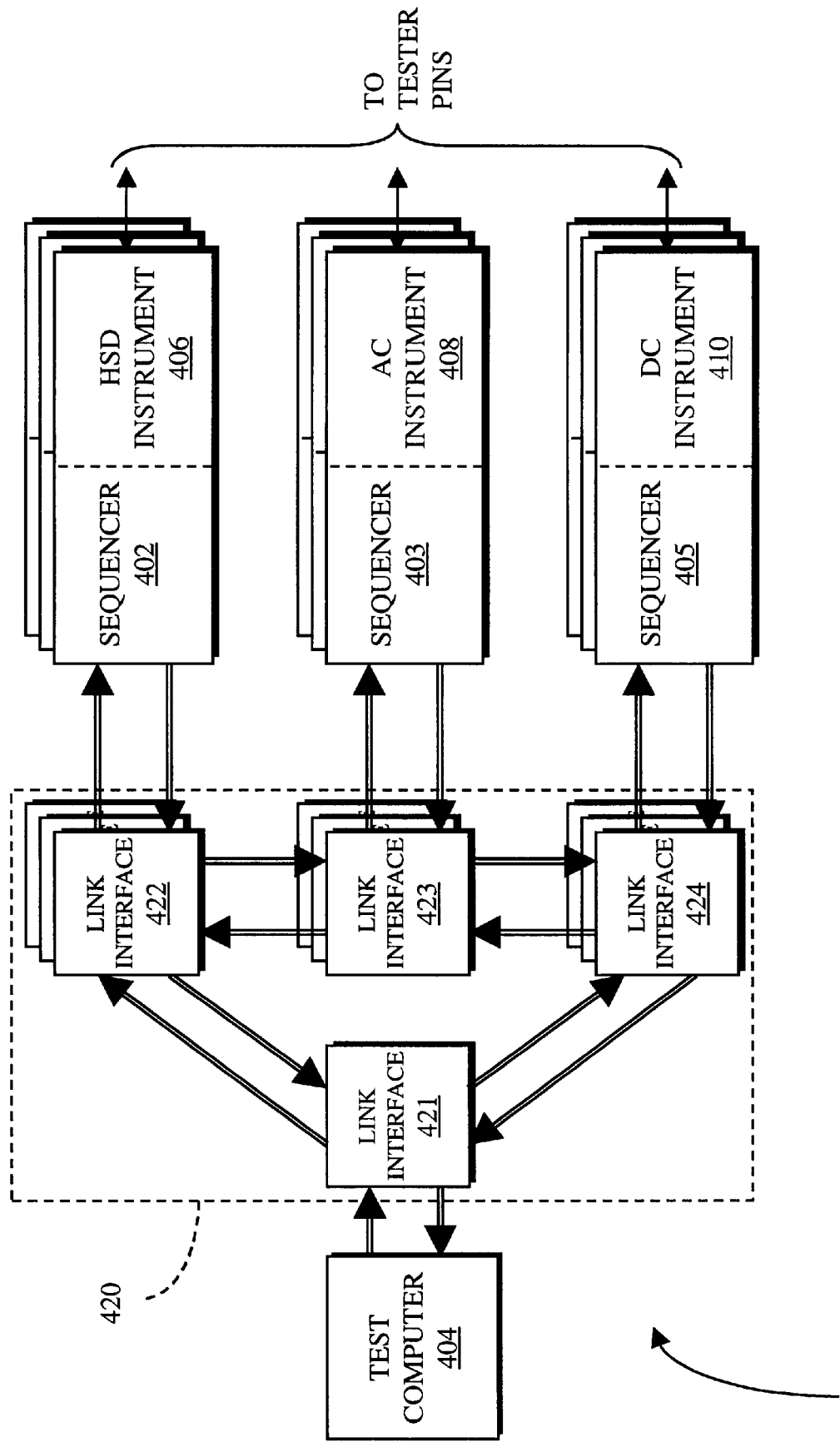
FIG. 4 is a block diagram of the FIG. 2A apparatus showing a detailed view of still another embodiment of the state distribution and recombination network.

FIG. 4 shows another tester 400 with a network 420, which includes link interfaces 421 through 424 in a "ring" arrangement. This arrangement is also simpler than the star arrangement in that each link interface in the network 420 has at most three (3) pairs of links communicating with it. However, once again there are trade-offs related to performance and manufacturability.

For example, state data passing between the sequencer 402 and the sequencer 403 passes through the two (2) link interfaces 422 and 423. However, state data passing between the sequencer 402 and the sequencer 405 passes through the three (3) link interfaces 422, 423, and 424. This constitutes the worst-case delay through the network 420.

Because data generally passes through three (3) link interfaces in the network 220 of the test system 200, the test system 400 can sometimes have less pipeline delay to the DUT than the test system 200. Nevertheless, timing considerations are generally simpler and more deterministic in the test system 200 because data generally passes through the same number of link interfaces in the network 220.

Therefore, the invention should be limited only by the spirit and scope of the appended claims.

What is claimed is:

1. Automatic test equipment for evaluating a semiconductor device, comprising:
   a test computer;
   a plurality of sequencers, wherein each sequencer controls testing activities of at least one instrument, and each instrument is arranged to be coupled to the semiconductor device; and
   a network of nodes interconnecting the test computer and the plurality of sequencers,
   wherein the delay through each node is adjustable, and each node of the network of nodes includes
     first bi-directional communication port coupled to a first element of the automatic test equipment; and
     a second bi-directional communication port coupled to a second element of the automatic test equipment.

2. The automatic test equipment as recited in claim 1, wherein each of the plurality of sequencers controls a different instrument.

3. The automatic test equipment as recited in claim 1, wherein the network of nodes are arranged in a star configuration.

4. The automatic test equipment as recited in claim 1, wherein the test computer and the plurality of sequencers are each coupled to a respective node.

5. The automatic test equipment as recited in claim 4, wherein each of the respective nodes is coupled to a central node.

6. The automatic test equipment as recited in claim 4, wherein the test computer and the plurality of sequencers are coupled to their respective nodes by way of a pair of uni-directional links.

7. The automatic test equipment as recited in claim 1, wherein each node includes circuitry for synchronizing data exchanged between the test computer and the plurality of sequencers with a system clock.

8. The automatic test equipment as recited in claim 7, wherein the synchronizing circuitry includes a FIFO.

9. The automatic test equipment as recited in claim 1, wherein the nodes are arranged in a serial configuration.

10. The automatic test equipment as recited in claim 1, wherein the nodes are arranged in a ring configuration.

11. The automatic test equipment as recited in claim 1, wherein each node includes circuitry for enabling passage of data through the node.

12. The automatic test equipment as recited in claim 11, wherein the enabling circuitry is programmable.

13. The automatic test equipment as recited in claim 12, wherein the enabling circuitry is programmed at the start of a test cycle.

14. The automatic test equipment as recited in claim 1, wherein each node includes at least one programmable pipeline delay element, and
wherein the delay through each node is adjusted by programming the at least one pipeline delay element.

15. The automatic test equipment as recited in claim 1, wherein each node includes circuitry for combining data.

16. The automatic test equipment as recited in claim 15, wherein an output of the combining circuitry is used for indicating a halt-on-fail condition.

17. The automatic test equipment as recited in claim 15, wherein an output of the combining circuitry is used for indicating a branching condition.

18. The automatic test equipment as recited in claim 1, wherein at least one node of the network of nodes further comprises:
a third bi-directional port coupled to a third element of the automatic test equipment.

19. The automatic test equipment as recited in claim 18, wherein the at least one node of the network of nodes further comprises:
a fourth bi-directional port coupled to a fourth element of the automatic test equipment.

20. The automatic test equipment as recited in claim 1, wherein the first and second elements of the automatic test equipment include any of the host computer, the plurality of sequencers, and any of the network of nodes.

21. The automatic test equipment as recited in claim 1, wherein the network of nodes comprises at least one node for each of the plurality of sequencers plus at least one additional node.

22. The automatic test equipment as recited in claim 1, wherein different ones of the plurality of sequencers operate at different cycle times.

23. The automatic test equipment as recited in claim 1, wherein at least one of the plurality of sequencers controls an analog test instrument.

24. The automatic test equipment as recited in claim 23, wherein the analog test instrument is an DC analog instrument.

25. The automatic test equipment as recited in claim 23, wherein the analog test instrument is a DC analog instrument.

26. The automatic test equipment as recited in claim 1, wherein at least one of the plurality of sequencers controls a digital test instrument.

27. A tester, used to determine whether an electronic circuit is functioning properly, comprising:
a test computer;
a plurality of sequencers, wherein each sequencer controls testing activities of at least one instrument and each instrument is arranged to be coupled to the electronic circuit; and
a plurality of point-to-point links interconnecting the test computer and the plurality of sequencers,
wherein each point-to-point link has a programmable delay and includes
a first bi-directional communication port coupled to a first element of the tester; and
a second bi-directional communication port coupled to a second element of the tester.

28. The tester as recited in claim 27, wherein each point-to-point link includes at least one programmable pipeline delay element for programming the delay.

29. The tester as recited in claim 27, wherein each point-to-point link includes circuitry for inhibiting the passage of data bits through the link.

30. The tester as recited in claim 29, wherein the inhibiting circuitry is programmable, and
wherein the inhibiting circuitry is programmed at the start of a test cycle.

31. The tester as recited in claim 27, wherein each point-to-point link carries a plurality of data bits in parallel, and
wherein each point-to-point link includes circuitry for combining at least a portion of the plurality of data bits.

32. The tester as recited in claim 27, wherein the plurality of links comprises at least one link for each of the plurality of sequencers plus at least one additional link.

33. A method of operating a tester, used to determine whether a device under test is functioning properly,
the tester including a test computer, a plurality of sequencers, a network of nodes interconnecting the test computer and the plurality of sequencers, and at least one instrument coupled between each of the plurality of sequencers and the device under test,
wherein each node includes
a first bi-directional communication port coupled to a first element of the tester; and
a second bi-directional communication port coupled to a second element of the tester, and
programmable circuitry for adjusting delay time through the network and for enabling and disabling passage of data through the network,
comprising the steps of:
(a) specifying the delay time through the network;
(b) setting up the programmable circuitry for passing selected data to the at least one sequencer;
(c) operating the at least one instrument to send test signals to the device under test in accordance with the selected data;
(d) operating the at least one instrument to receive signals produced by the device under test in response to the test signals; and
(e) comparing the received signals with expected values, thereby determining whether the device under test is functioning properly.

* * * * *